(12) United States Patent
Thompson

(10) Patent No.: US 10,562,448 B2
(45) Date of Patent: Feb. 18, 2020

(54) STEERING WHEEL HORN ASSEMBLY

(71) Applicant: Otnid Bellot Thompson, Fort Lauderdale, FL (US)

(72) Inventor: Otnid Bellot Thompson, Fort Lauderdale, FL (US)

( * ) Notice: Subject to any disclaimer, the term of this patent is extended or adjusted under 35 U.S.C. 154(b) by 0 days.

(21) Appl. No.: 16/558,269

(22) Filed: Sep. 2, 2019

(65) Prior Publication Data

US 2019/0389374 A1 Dec. 26, 2019

Related U.S. Application Data

(63) Continuation-in-part of application No. 15/675,444, filed on Aug. 11, 2017, now Pat. No. 10,399,489.

(51) Int. Cl.
| | |
|---|---|
| *H01H 9/00* | (2006.01) |
| *B60Q 5/00* | (2006.01) |
| *B62D 1/04* | (2006.01) |
| *B62D 1/06* | (2006.01) |
| *H05K 1/11* | (2006.01) |
| *H01H 13/702* | (2006.01) |
| *H01H 13/12* | (2006.01) |
| *H01H 13/08* | (2006.01) |
| *H01H 13/79* | (2006.01) |

(Continued)

(52) U.S. Cl.
CPC ............ *B60Q 5/003* (2013.01); *B60R 16/033* (2013.01); *B62D 1/046* (2013.01); *B62D 1/06* (2013.01); *H01H 13/08* (2013.01); *H01H 13/12* (2013.01); *H01H 13/702* (2013.01); *H01H 13/79* (2013.01); *H01H 13/807* (2013.01); *H01H 13/86* (2013.01); *H05K 1/119* (2013.01); *H01H 13/52* (2013.01); *H01H 2225/008* (2013.01); *H01H 2231/026* (2013.01); *H05K 2201/09027* (2013.01)

(58) Field of Classification Search
CPC ........ B60Q 5/003; B60Q 3/283; B62D 1/046; H01H 13/81; H01H 2231/026
See application file for complete search history.

(56) References Cited

U.S. PATENT DOCUMENTS

| | | | |
|---|---|---|---|
| 1,471,778 A | 10/1923 | Cope | |
| 1,748,015 A | 2/1930 | Douglas | |

(Continued)

*Primary Examiner* — Munear T Akki
(74) *Attorney, Agent, or Firm* — Mark C. Johnson; Johnson | Dalal

(57) ABSTRACT

A steering wheel horn assembly having two sections with an annular electrical circuit board member interposed and disposed between the sections and electrically coupled to a power source, an electrical ground, and an electrical horn. Also disposed within the two sections is an annular button membrane with a plurality of deformably resilient horn buttons, wherein each of the plurality of deformably resilient horn buttons have a terminal front surface and a rear surface opposing the terminal front surface and that is disposed adjacent to the annular electrical circuit board member, have a static position along a button translation path projecting through one of the plurality enclosed apertures, and have a depressed position with the rear surface directly coupled to the annular electrical circuit board member and electrically completing a circuit on the annular electrical circuit board member and causing the electrical horn to generate the audible sound.

8 Claims, 10 Drawing Sheets

(51) Int. Cl.
*H01H 13/807* (2006.01)
*H01H 13/86* (2006.01)
*B60R 16/033* (2006.01)
H01H 13/52 (2006.01)

(56) References Cited

U.S. PATENT DOCUMENTS

| | | | |
|---|---|---|---|
| 2,579,292 | A | 12/1951 | Breisford |
| 4,638,131 | A | 1/1987 | Kidd et al. |
| 4,742,192 | A * | 5/1988 | Levine .................. H01H 3/142 200/61.57 |
| 6,928,351 | B2 | 8/2005 | Bowmann |
| 8,003,902 | B1 * | 8/2011 | Cannella .................. B60Q 1/46 200/1 B |
| 8,738,224 | B2 | 5/2014 | Goldman-Shenhar |
| 9,738,220 | B2 | 8/2017 | Borghi |
| 9,881,605 | B2 | 1/2018 | Takei et al. |
| 10,036,843 | B2 | 7/2018 | Lisseman |
| 2003/0141978 | A1 * | 7/2003 | D'Agosto .............. G08B 21/06 340/575 |
| 2010/0276264 | A1 | 11/2010 | Boeckstiegel et al. |
| 2012/0179328 | A1 * | 7/2012 | Goldman-Shenhar ...................... B62D 1/046 701/36 |
| 2013/0169040 | A1 | 7/2013 | Hallet |
| 2016/0311366 | A1 * | 10/2016 | Lisseman .............. G02B 6/0085 |
| 2016/0336009 | A1 * | 11/2016 | Takei ...................... G10L 15/22 |
| 2016/0355179 | A1 * | 12/2016 | Cannella .................. B60T 7/22 |
| 2017/0057409 | A1 * | 3/2017 | Borghi .................. B60Q 5/003 |

* cited by examiner

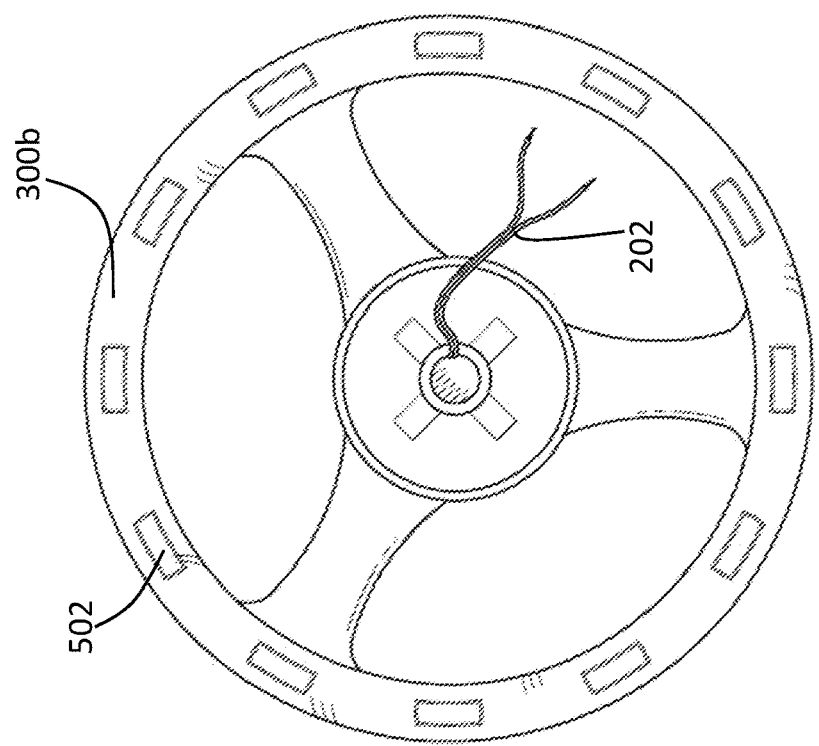
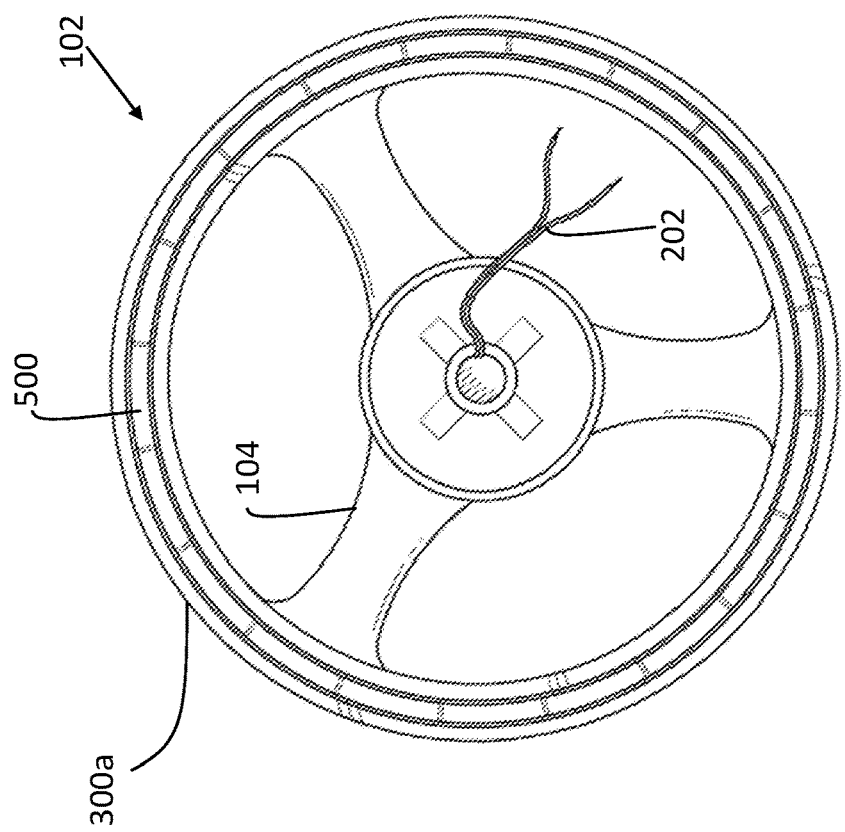
FIG. 5

STEERING WHEEL HORN ASSEMBLY

CROSS-REFERENCE TO RELATED APPLICATION

This application is a continuation-in-part and claims priority to U.S. Ser. No. 15/675,444, currently pending, and filed Aug. 11, 2017, the entirety of which is incorporated by reference.

FIELD OF THE INVENTION

The present invention relates generally horns, and, more particularly, relates to a horn that is operationally integrated into a vehicle steering wheel.

BACKGROUND OF THE INVENTION

Typically, vehicles, such as cars, trucks, vans, SUV's, tractor trailers, and buses, include a horn that can be engaged by the operator of the vehicle to produce audible warnings to the operators of other vehicles and to pedestrians. Horns work particularly well in rather quiet environments, such as country roadways, where the variety and intensity of sound is limited and relatively subdued. Busy city roads are another matter.

A typical conventional steering wheel for a vehicle is configured so that spokes extend radially from a boss which is secured to a steering shaft, and a steering wheel rim is secured to the respective distal ends of the spokes so that the driver grips the rim when steering the vehicle. The operator grasps the circumferential region of the steering wheel and spins the wheel to turn the vehicle.

Often, the operator of the vehicle is preoccupied with steering, watching for pedestrians, oncoming traffic, and other road conditions. This can leave the operator with insufficient time to remove the hands from the steering wheel and activate the horn, thereby posing an inherent safety risk to the driver, passengers of the vehicle, and other individuals. Also, due to the high level of noise outside the vehicle, horn signals are often hard to hear particularly by those with diminished hearing.

Therefore, a need exists to overcome the problems with the prior art as discussed above.

SUMMARY OF THE INVENTION

The invention provides a steering wheel horn assembly that overcomes the hereinafore-mentioned disadvantages of the heretofore-known devices and methods of this general type and that enables quick and effective activation of a vehicle's horn, thereby generating an audible sound. The steering wheel horn assembly includes two sections with an annular electrical circuit board member interposed and disposed between the sections and electrically coupled to a power source, an electrical ground, and an electrical horn. Disposed within the two sections is an annular button membrane with a plurality of deformably resilient horn buttons, wherein each of the plurality of deformably resilient horn buttons have a terminal front surface and a rear surface opposing the terminal front surface and that is disposed adjacent to the annular electrical circuit board member, have a static position along a button translation path projecting through one of the plurality enclosed apertures defined on the steering wheel, and have a depressed position with the rear surface directly coupled to the annular electrical circuit board member and electrically completing a circuit on the annular electrical circuit board member and causing the electrical horn to generate the audible sound.

Although the invention is illustrated and described herein as embodied in a steering wheel horn assembly, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used herein, the terms "about" or "approximately" apply to all numeric values, whether or not explicitly indicated. These terms generally refer to a range of numbers that one of skill in the art would consider equivalent to the recited values (i.e., having the same function or result). In many instances, these terms may include numbers that are rounded to the nearest significant figure.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

FIG. 5 is a sectioned view of a front and rear section of a steering wheel horn assembly, in accordance with another embodiment of the present invention;

DETAILED DESCRIPTION

Figure 1:
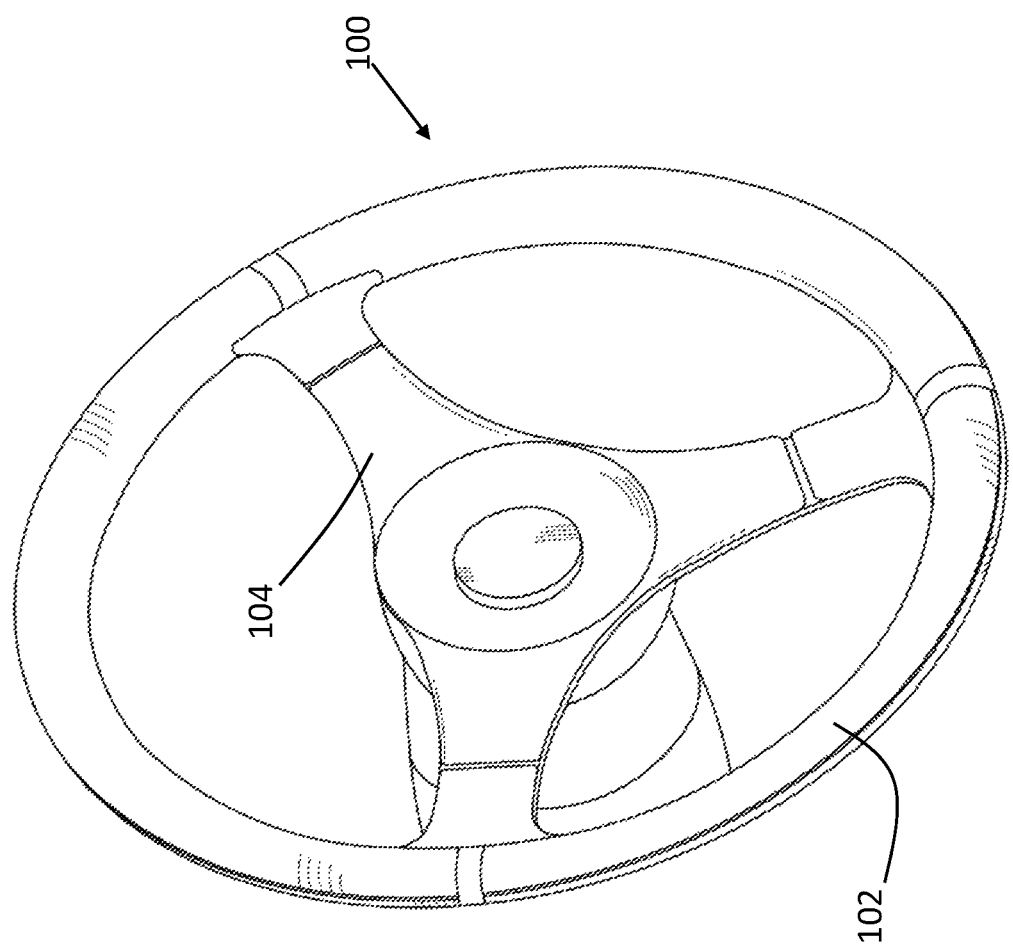
FIG. 1 is a perspective view of an exemplary steering wheel horn assembly, in accordance with the present invention.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

Figure 4:
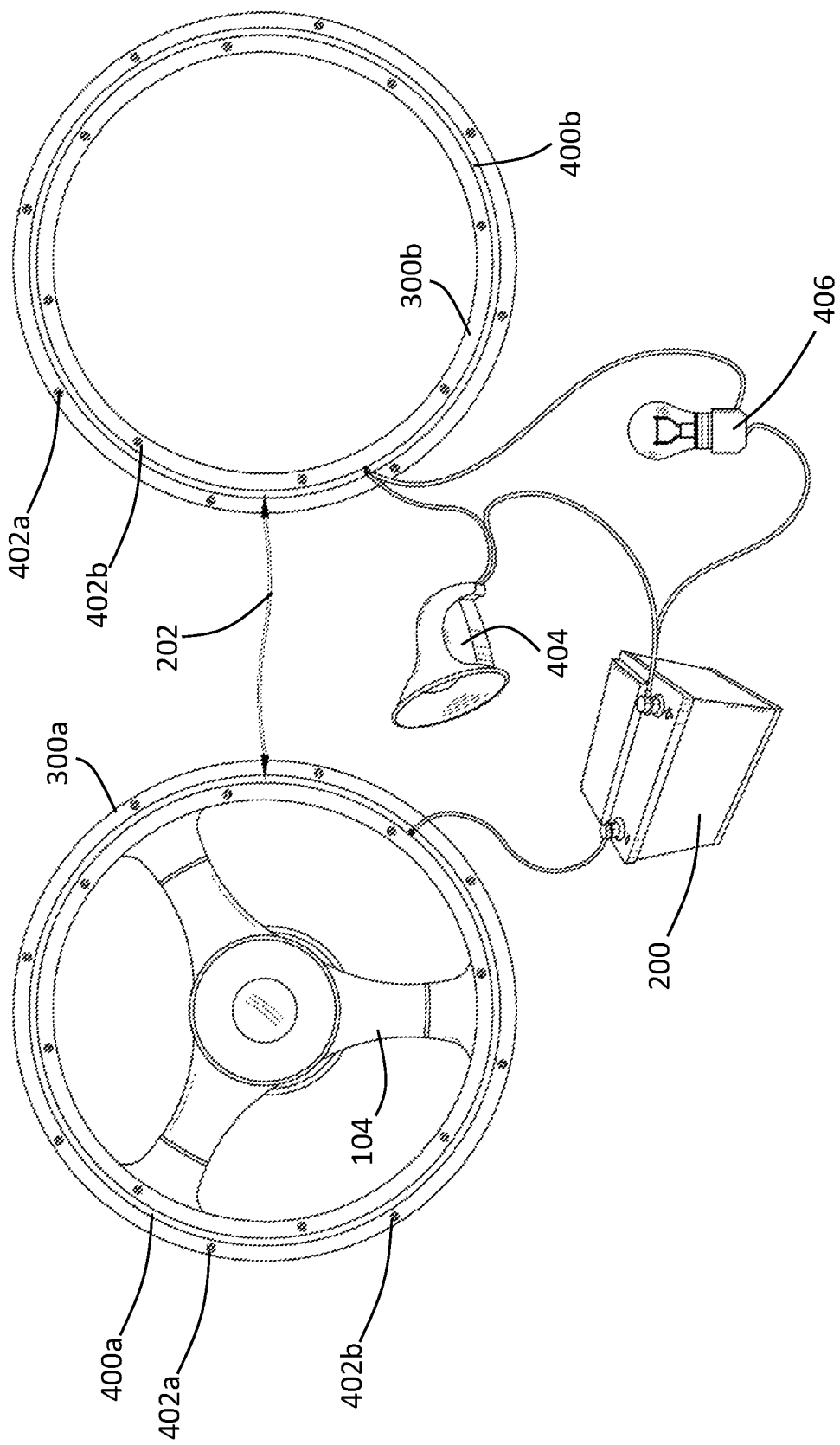
FIG. 4 is a sectioned and schematic view of a front and rear portion of the steering wheel horn assembly shown in FIG. 1, in accordance with the present invention.

With reference to FIGS. 1 and 4, the present invention provides a novel and efficient steering wheel horn assembly 100 that is operatively connected to a steering system 104 of a vehicle, e.g., a car, bus, train, etc., for operating an electrical horn 404 and/or a vehicle light 406, or both in direct response to driver-initiated pressure applied to a steering wheel body 102. While the figures show several advantageous features of the present invention, as will be described below, the invention can be provided in several shapes, sizes, combinations of features and components, and varying numbers and functions of the components.

The steering wheel horn assembly 100, hereafter "assembly 100," is operably configured to enable operation of an electrical horn 404 commonly used in motorized vehicles through driver-initiated application of pressure on the steering wheel body 102. The assembly 100 effectively permits a driver to safely activate the horn 404 without the driver having to remove one or more hands from the steering wheel body 102. In this manner, the hands of the driver remain on the steering wheel 104 to simultaneously steer the vehicle, and actuate the horn. This frees the driver to concentrate more acutely on the task of driving.

Furthermore, the assembly 100 can also actuate the vehicle lights 406 to generate an illumination through application of pressure on the steering wheel body 102. The illumination from the light 406 may be actuated simultaneously with the audible sound from the horn 404. This allows for both a visual and audible sound for getting the attention of pedestrians and oncoming traffic in the path of the vehicle.

In other embodiments, the audible sound generated by the electrical horn 404 and the illumination from the light 406 may be variable increased and decreased through variations in the pressure that the driver applies to the steering wheel body 102. Additionally, the intensity of the light and/or audible sound may be increased by the duration of electrical contact (as discussed herein) using, for example, a time counter communicatively coupled to a process on a PCB board. Thus, by allowing the driver to operate the electrical horn 404 and the light 406 directly from the steering wheel body 102, the driver does not have to remove one or more hands from the steering wheel body 102 to activate the electrical horn 404 or the light 406.

Figure 2:
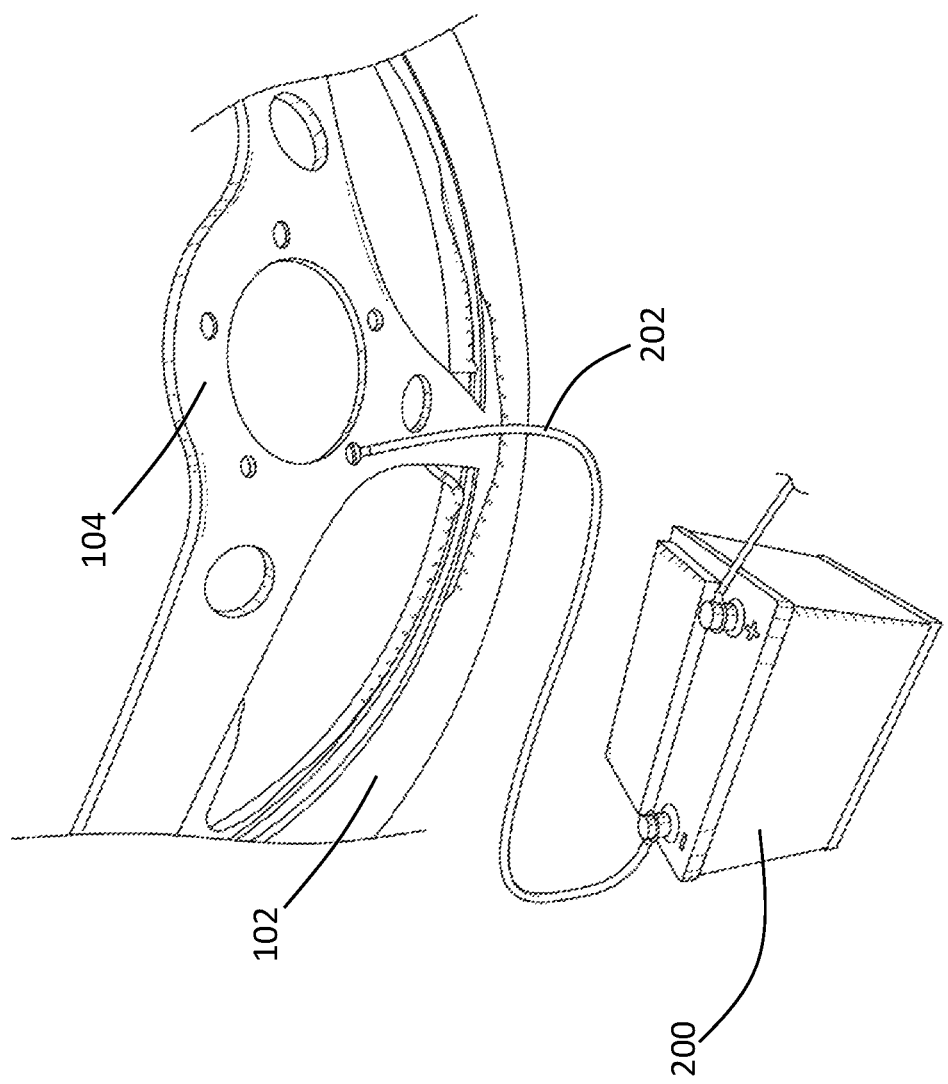
FIG. 2 is a perspective view of an exemplary power source and ground for completing a circuit of the steering wheel horn assembly, in accordance with the present invention.
Figure 3:
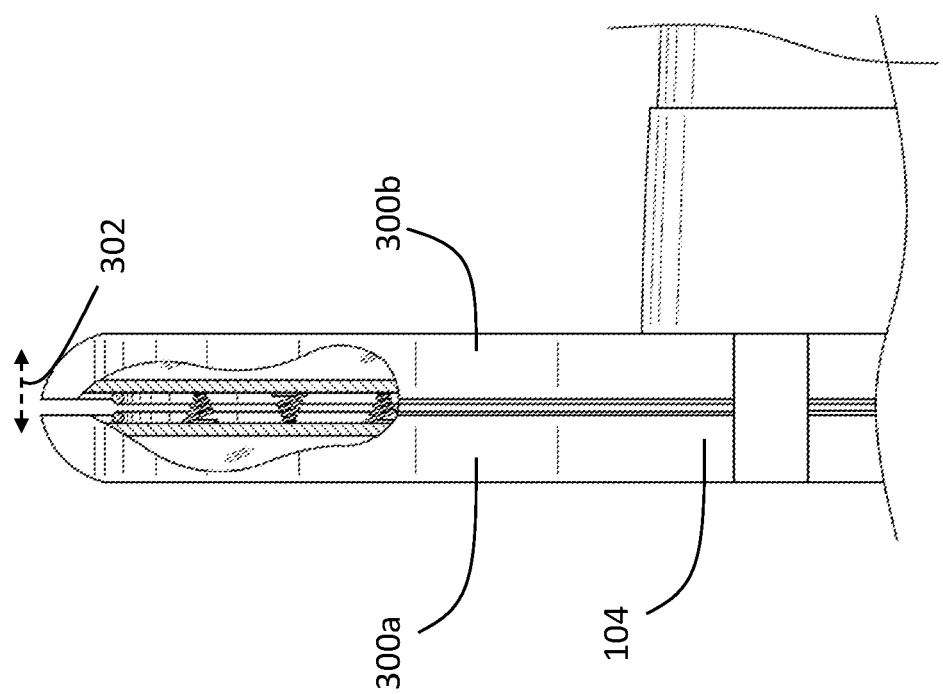
FIG. 3 is a close-up elevational side view of the circular steering wheel body bifurcated into first and second steering wheel body sections, in accordance with the present invention.

With reference now to FIGS. 2-4, embodiments of the invention provide a circular steering wheel body 102 that is bifurcated or separated into a first steering wheel body section 300a and a second steering wheel body section 300b. The first and second steering wheel body sections 300a-b are configured to substantially encapsulate a portion of the vehicle steering wheel 104. The steering wheel body sections 300a-b include cooperating first and second electrical contact members 400a, 400b that transmit electrical current when engaged, but are biased in tension through a plurality of springs 402a, 402b to remain disengaged. In one embodiment, there are four springs disposed circumferentially around the wheel 104 in equal distances, wherein each spring has a spring constant "k" of approximately 15-30 lbf/in, thereby providing sufficient resistance force that would otherwise inadvertently trigger the horn by the weight or pressure of the user's hands. In other embodiments, the spring constant, amount of springs, and location of the springs may vary.

In addition, embodiments of the invention allow the first and second steering wheel body sections 300a-b to be pressed together through application of pressure from the driver's hands to the steering wheel body 102. Through application of this pressure by the driver, the electrical contact members 400a-b are forced together to complete an electrical circuit, thereby actuating an audible sound from the electrical horn 404, or increased illumination of a vehicle's head light 406, or both.

With the foregoing and other objects in view, there is provided, in accordance with the invention, a steering wheel horn assembly 100 that is operable in an active mode to generate an audible sound from a horn, based on application of pressure thereon.

The assembly 100 includes a steering wheel body 102 rotatably couplable to a vehicle steering wheel 104, and specifically encapsulates all or a portion of the circumference of the vehicle steering wheel 104. In some embodiments, the vehicle may include, without limitation, an automobile, a motorcycle, a boat, and an aircraft. In one embodiment, the steering wheel body 102 is operationally attached to a steering wheel that directs the vehicle in a desired direction.

In another embodiment, the steering wheel body 102 is integral to a steering system that is manipulated by the driver, responding directly to driver inputs, such as rotating the steering wheel body 102. This manipulation can be through direct mechanical contact with the steering system as in recirculating ball or rack-and-pinion steering gears, or with the assistance of computer-controlled motors, e.g., electric power steering.

In one embodiment, steering wheel body 102 is defined by a generally circular shape, and is mounted to a steering column by a hub connected to the outer ring of the steering wheel by one or more spokes. However, in other embodiments, the steering wheel body 102 may have an oval shape, a butterfly shape, a square shape, or other shape known in the art of steering mechanisms. In yet another embodiment, the steering wheel body 102 comprises at least one control stick, such as found on airboats. In one embodiment, the steering wheel body 102 also typically mounts on the left side of the vehicle. However, in countries where vehicles drive on the left side of the road, the steering wheel body 102 mounts may be mounted on the right side of the vehicle.

In operation, the steering wheel 104 is used with strategic movements of the hand and wrist in spinning/rotating motions. The driver grips the circumference of the steering wheel body 102 and rotates/spins the steering wheel 104 to the left for steering left, and to the right for steering right. The arc of rotation by the steering wheel 104 is determinative of the amount of steerage by the wheels.

Turning now to FIG. 2, the assembly 100 further comprises a power source 200 and an electrical ground 202 that are operably configured to provide power and form an electrical reference point for the assembly 100. The power source 200 may include an independent battery that is used to power the assembly 100. However, the power source 200 may also include a vehicle battery, such as an integrated automotive battery or a rechargeable battery that supplies electrical energy to the vehicle. In some embodiments, the power source 200 may include, without limitation, a 12 V, 40 Ah lead-acid car battery.

The electrical ground 202 may include a reference point in an electrical circuit from which voltages from the power source 200 are measured, a common return path for electric current, or a direct physical connection to a surface of the vehicle or Earth. In one embodiment, a wire attaches to the spokes of the steering wheel for the ground 202 (FIG. 2).

As illustrated in FIG. 3, the steering wheel body 102 comprises a first steering wheel body section 300a and a second steering wheel body section 300b. The second steering wheel body section 300b is superimposed and unitarily translatably coupled with the first circular wheel body section 300a. Said another way, the body section 300b is operably configured to move as a single piece with respect to the other section 300a. This is not to say, however, that the entire body section 300b is required to translate as one piece to form an electrical circuit providing power to the horn, as only a portion of the body section 300b may be required to do so. In one embodiment, the steering wheel body 102 is bifurcated into two equal sizes and dimensions of the first and second steering wheel body sections 300a-b. The first and second steering wheel body sections 300a-b may thus, clamp around the steering wheel 104, or be integrated therein, forming the steering wheel itself.

As referenced in FIG. 4, a plurality of springs 402a-n, wherein "n" represents any number greater than 1, are disposed between the steering wheel body sections 300a-b. The springs 402a-b are coupled to at least one of the steering wheel body sections 300a-b. The springs are configured 402a-b to bias the steering wheel body sections 300a-b apart from each other by exerting a spring tension against opposing steering wheel body sections 300a-b.

In one embodiment, the spring tension may be adjusted to vary the pressure required to press the first and second steering wheel body sections 300a-b together. Also, the number of springs 402a, 402b may be increased or decreased to vary the pressure required to press together the first and second steering wheel body sections 300a-b. In one embodiment, either the first or second steering wheel body sections 300a-b is displaced in relation to each other. In another embodiment, both steering wheel body sections 300a-b are displaced simultaneously in relation to each other.

As illustrated in FIGS. 3-4, the first steering wheel body section 300a comprises a first electrical contact member 400a. The first electrical contact member 400a may include metal or other known conductive elements that completes an electrical circuit (when electrically coupled to a contact member 400b) between power source 200, ground 202, and electrical horn 404, and/or light 406. As such, similar to the first steering wheel body section 300a, the second steering wheel body section 300b includes the second electrical contact member 400b. The first and second electrical contact members 400a-b are each respectively flanked by the first and second steering wheel body sections 300a-b, positioned along a wheel section translation path (exemplarily represented with arrow 302). The translation path 302 may be linear and/or curvilinear and may span a length separating the electrical contact members 400a-b. As discussed below, the electrical contact members 400a-b may form a continuous bar, or a series of tightly spaced-apart contact members, i.e., members spaced approximately four inches or less away from another.

The first and second steering wheel body sections 300a-b form a cooperating arrangement that allows each section 300a-b to be displaced closer and further in relation to each other based on a pressure applied thereto. Thus, as the first and second steering wheel body sections 300a-b are displaced, their respective electrical contact members 400a-b engage and disengage to close and open a circuit. Further, the contact members 400a-b may also travel with the respective body section 300a-b in which it is coupled.

At least one of the first and second electrical contact members 400a-b are electronically coupled to the power source 200, the electrical ground 202, and to the horn. As those of skill in the art will appreciate, this electrical interconnection forms an electrical circuit that is closed and opened, depending on the position of the steering wheel body sections 300a-b relative to each other.

As shown in FIG. 4, the first and second electrical contact members 400a-b may be disposed in a circular and continuous arrangement in alignment with their respective steering wheel body sections 300a-b. Said another way, the contact members 400a-b are substantially free from discontinuities, in that there is at least one portion of the respective members that is continuous. This may include an electrically conductive continuous bar, preferably having a substantially planar outermost surface to provide greater surface contact, that follows the shape of the wheel.

An alternative embodiment of the electrical contact members is illustrated in FIG. 5. Here, one or both of the first and second electrical contact members are a series of independent conductive members 502 that are disposed in a tight, substantially equal spaced-apart relationship spanning the circumference of the first steering wheel body section 300a-b. Thus, the electrical contact members 502 may be intermittently disposed in a tightly spaced arrangement of separate metal contacts that span the circumference of the steering wheel body 102. The electrical contact members 502 may also be independently coupled to a button with one or more LEDs that are operably configured to light up. To that end, the one or more LEDs may be electrically coupled to the power source, e.g., battery 200.

Whether as a continuous bar, or independently disposed in a spaced-apart relationship, the first and second electrical contact members 400a-b engage each other to close the circuit as the driver squeezes the first and second steering wheel body sections 300a-b together. Alternatively, with respect to the second embodiment shown in FIG. 5, each of the contact members 502 may be independently translatable (in a direction akin to the translation path 302 shown in FIG. 3) a length sufficient to make electrically connection or couple with the opposing electrical member 500. The coupling closes the electrical circuit, and thereby places the steering wheel body 102 in the active position. The active position is formed along a wheel section translation path 302 as a result of the pressure applied to the first and second steering wheel body section 300a-b.

As the first and second electrical contact members 400a-b are operatively coupled to the power source 200, the ground 202, and the electrical horn 404, the closed circuit actuates an audible sound from the electrical horn 404. The active position actuates the audible sound from the electrical horn 404, the illumination from the light 406, or both.

Conversely, as the driver releases the steering wheel body 102, the springs 402a-b bias the first and second electrical contact members 400a-b to physically uncouple from one another. As discussed above, the springs 402a-b work to bias the circular wheel body to the inactive position, as spring tension displaces the first and second steering wheel body sections 300a-b apart from each other. This forms the inactive position, in which the electrical circuit is opened. In the inactive position the audible sound from the electrical horn 404, the illumination from the light 406, or both, are deactivated.

It is significant to note that the amount of pressure that must be applied by the driver to the first and second steering wheel body sections 300a-b to actuate the active position may be adjusted. This adjustment can include varying the spring tension or constant, k, of the springs 402a-b, or adding or removing springs 402a-b from the first steering wheel body section 300a-b. This can be useful to adapt to drivers with different hand strengths.

In an alternative embodiment, the active mode of the assembly 100 generates an illumination form the vehicle lights 406. The application of pressure on the first and second steering wheel body sections 300a-b closes the circuit to actuate an illumination from the vehicle light 406. Thus, the illumination is simultaneously operable with the audible sound from the electrical horn 404. This feature of the assembly 100 provides a combined visual and audible sound for getting the attention of pedestrians and oncoming traffic in the path of the vehicle. Such externally visible vehicle lights may include, without limitation, headlights, taillights, running lights, parking lights, or other externally-mounted lights.

In other embodiments, the audible sound and the illumination may be variable increased and decreased by varying the amount of pressure or time that is applied to the steering wheel body 102. Thus, as the driver increases the pressure on the steering wheel body 102 or holds a particular amount of pressure to the steering wheel body for a particular period of time, the volume of the audible sound, or the intensity of the illumination increases proportionally to the applied pressure. In one embodiment, pressing the steering wheel body 102 into the active mode, creates externally visible vehicle lights 406 that can be contemporaneously dimmed or brightened.

Figure 6:
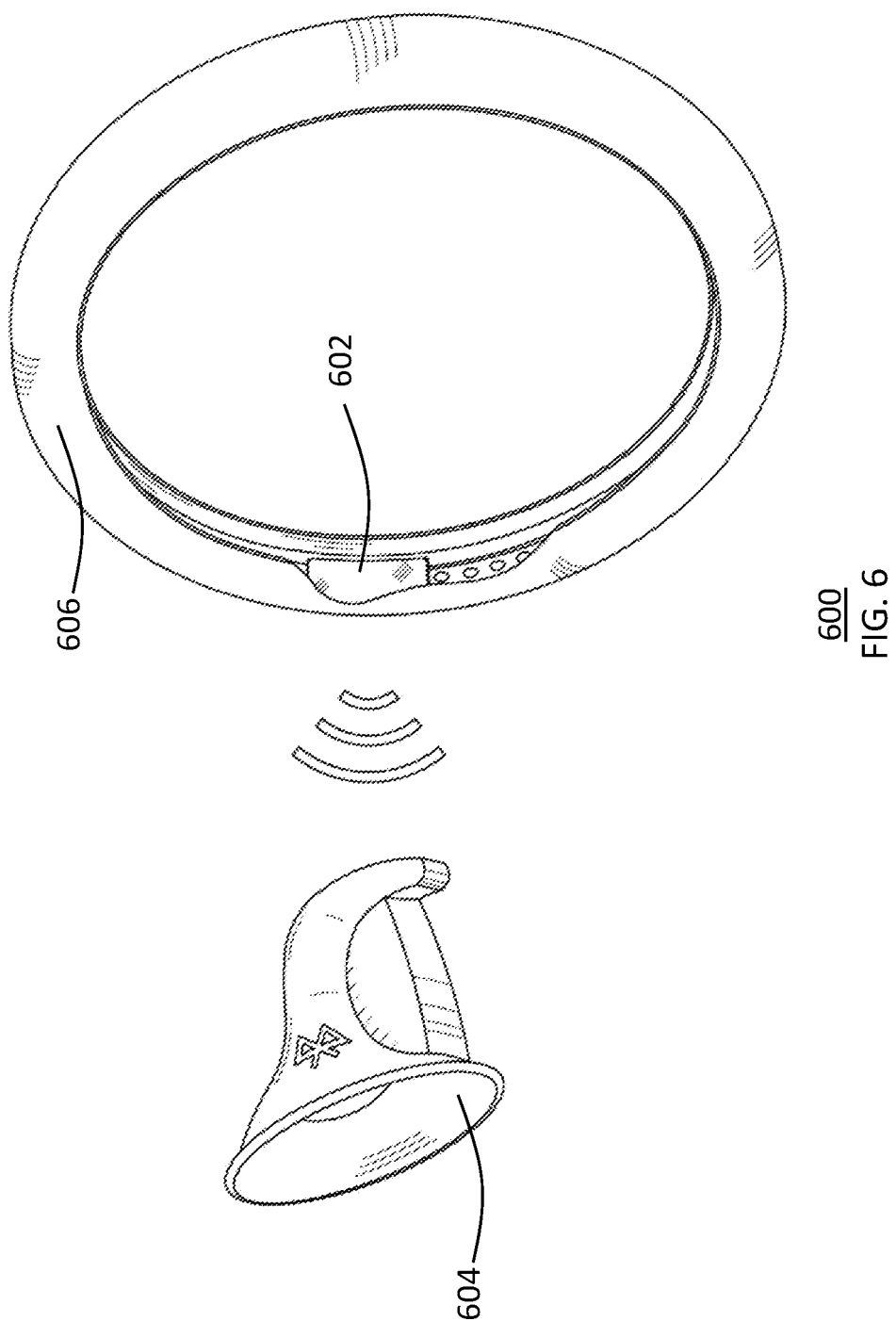
FIG. 6 is a perspective view of an alternative embodiment of a steering wheel horn assembly, showing Bluetooth data transmission to actuate an electrical horn, in accordance with the present invention.
Figure 7:
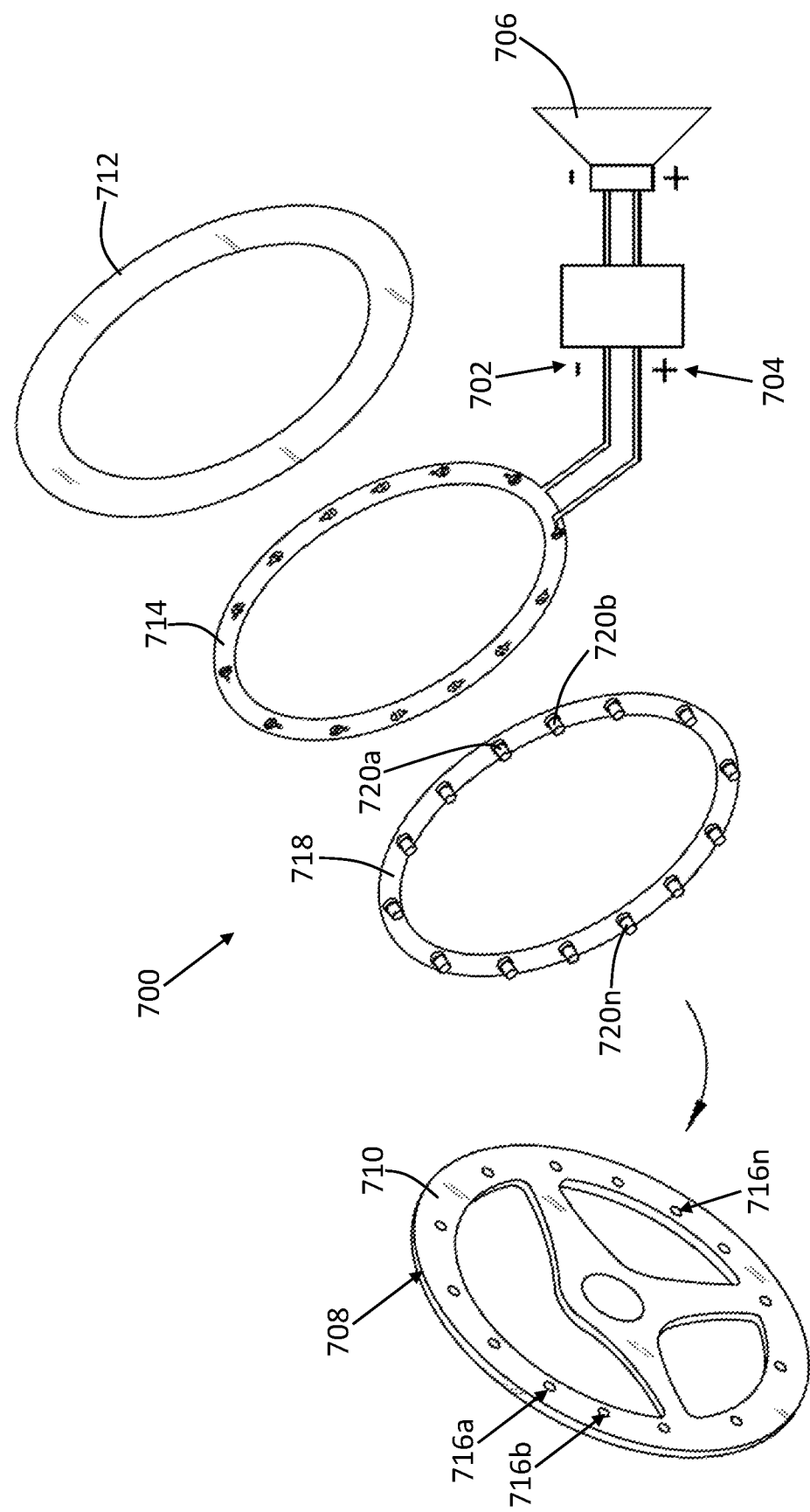
FIG. 7 is an exploded view of an exemplary steering wheel horn assembly, in accordance with another embodiment of the present invention.
Figure 8:
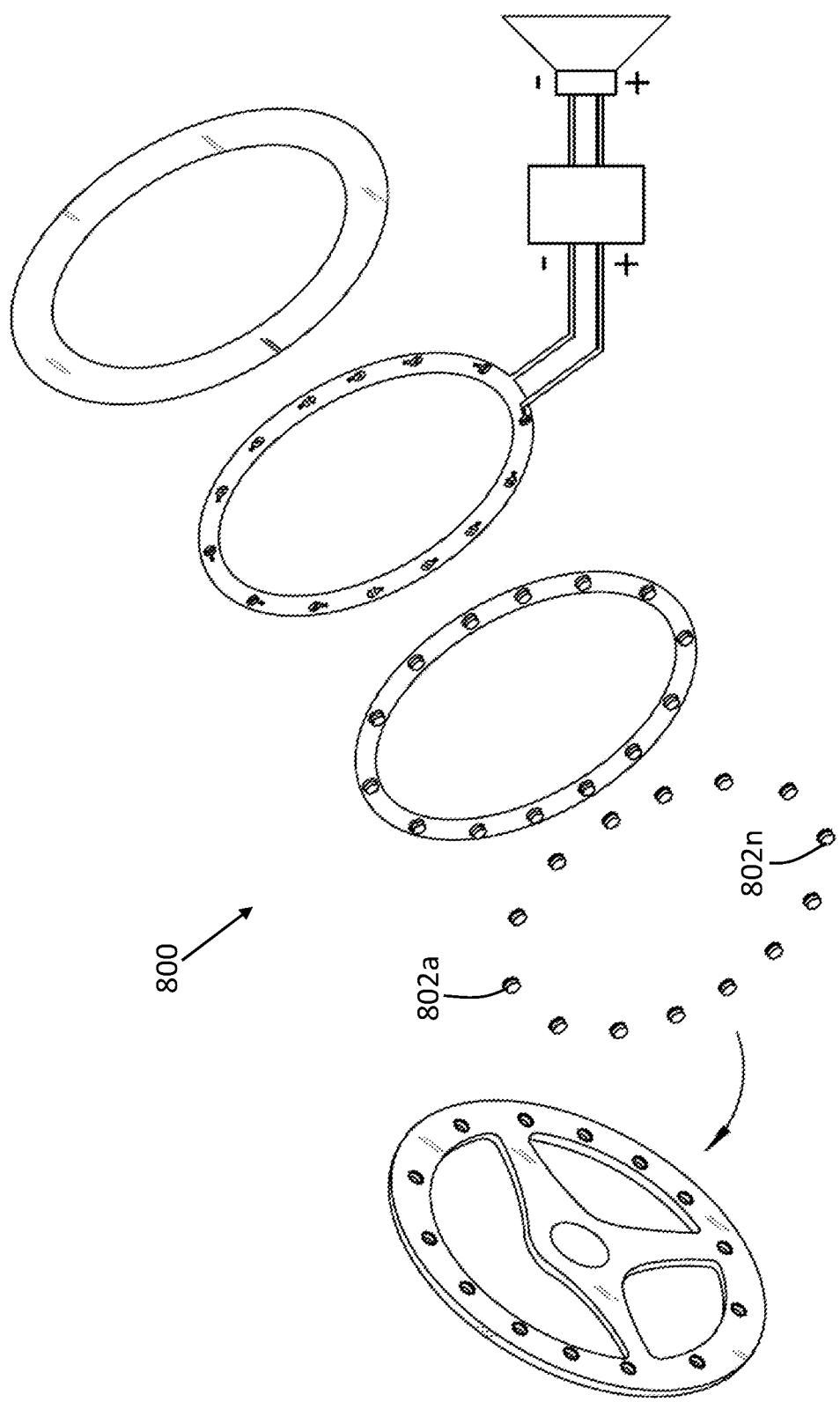
FIG. 8 is an exploded view of an exemplary steering wheel horn assembly, in accordance with yet another embodiment of the present invention.

Yet another alternative embodiment of a steering wheel horn assembly 600 is referenced in FIG. 6. In this embodiment, the assembly 600 utilizes Bluetooth™ technology to transmit a signal for actuating an audible sound from a Bluetooth adapted horn 604. A data transmitter 602 operatively couples to the steering wheel body 606. As the steering wheel body 606 is pressed to achieve the active position, the transmitter 602 exchanges data with the Bluetooth adapted horn 604 using short-wavelength UHF radio waves in the ISM band from 2.4 to 2.485 GHz, or other wavelengths known in the art.

It is significant to note that with this Bluetooth embodiment, the circuitry is not used, but rather data signals are wirelessly transmitted to actuate the audible sound, or the illumination, or both. In operation, any place on the steering wheel body 606 may be pressed by the driver to actuate the transmitter 602, and thereby transmit the data for actuating the Bluetooth adapted horn 604. In yet another alternative embodiment, the Bluetooth™ technology of the assembly 600 is applicable with a relay microchip that actuates the light 406 to flash bright lights. This visual indicator can be useful for pedestrians and oncoming vehicles that cannot hear the Bluetooth horn 604.

In accordance with the present invention, a method for operation of a steering wheel horn assembly actuates an audible sound from a horn of a motorized vehicle through driver-initiated application of pressure on a circular steering wheel body. The method includes an initial Step of coupling a power source and an electrical ground to an electrical horn of a vehicle.

The method also includes a Step of providing a steering wheel body that is rotatably couplable to the vehicle. The steering wheel body comprises a first steering wheel body section with a first electrical contact member, and a second steering wheel body section superimposed and unitarily translatably coupled with the first circular wheel body section, and having a second electrical contact member.

Another Step comprises applying pressure to the steering wheel body, such that the first and second electrical contact members engage; whereby an electrical circuit is closed with the power source, the ground, and the electrical horn. A final Step includes actuating the horn to emit an audible sound, the audible sound having a volume that is in relation to the pressure applied to the steering wheel body.

These and other advantages of the invention will be further understood and appreciated by those skilled in the art by reference to the following written specification, claims and appended drawings.

With reference to FIGS. 7-12, other embodiments of the present invention are also depicted. As apparent to those of skill in the art, many of the same features, components, and functionality depicted and described with reference to FIGS. 1-6, may also be applicable to the assembly 700 and assembly 800 depicted in FIGS. 7-12. More specifically, the wheel horn assembly 700 may include a power source 702, an electrical ground 704, an electrical horn 706 having an active mode generating an audible sound, and a steering wheel body 708.

The steering wheel body 708 may include a first steering wheel body section 710 defining a front surface 900 surrounding the steering wheel body 708 and a plurality enclosed apertures 716a-n disposed on the front surface 900. The plurality enclosed apertures 716a-n disposed on the front surface 900 may be circular or another shape and may be approximately 0.5-1.5 inches in diameter/width. Said another way, the plurality enclosed apertures 716a-n may be shaped and sized to receive a plurality of deformably resilient horn buttons 720a-n, as discussed further herein, wherein the letter "n" represents any number greater than one. The steering wheel body 708 also includes a second steering wheel body section 712 that may define a rear surface 902, opposing the front surface 900, and that surrounds the steering wheel body 708. In one embodiment, the first and second steering wheel body sections 710, 712 may be directly coupled together without any space surrounding a perimeter thereon. In other embodiments, the first and second steering wheel body sections 710, 712 may be spaced apart from one another surrounding the perimeter thereon. The first and second steering wheel body sections 710, 712 may be of a substantially rigid material.

Interposed between the first and second steering wheel body sections 710, 712 is an annular electrical circuit board member 714, or a PCB board operably configured to complete a circuit and provide power to an electrical device. The annular electrical circuit board member 714 is electrically coupled to the power source 702, the electrical ground 704, and the electrical horn 706. The assembly may also include an annular button membrane 718 interposed between the annular electrical circuit board member 714 and the first steering wheel body section 710. The annular button membrane 718 includes the plurality of deformably resilient horn buttons 720a-n. Each of the plurality of deformably resilient horn buttons 720a-n have a terminal front surface 904 and a rear surface 906 opposing the terminal front surface 904 and may be disposed adjacent, i.e., at or close to, to the annular electrical circuit board member 714.

Figure 10:
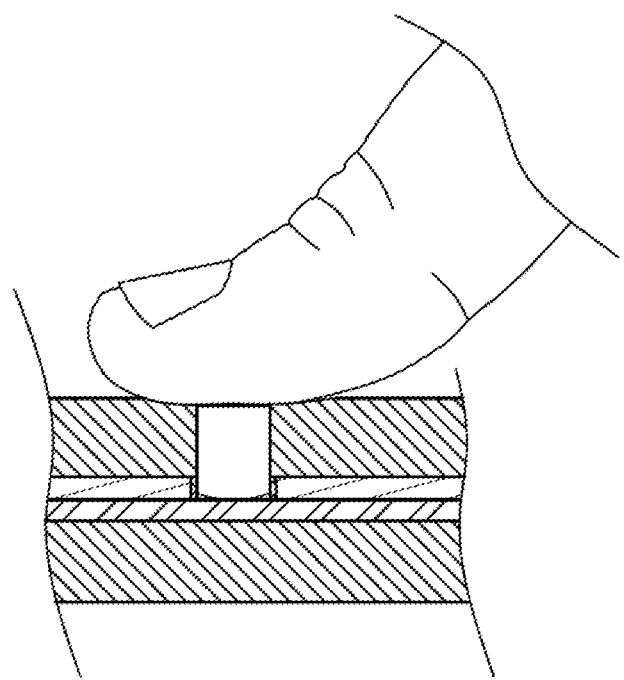
FIGS. 9-10 are close-up views of a button on an exemplary steering wheel horn assembly in a static position and depressed position, respectively, along a button translation path in accordance with one embodiment of the present invention.
Figure 9:
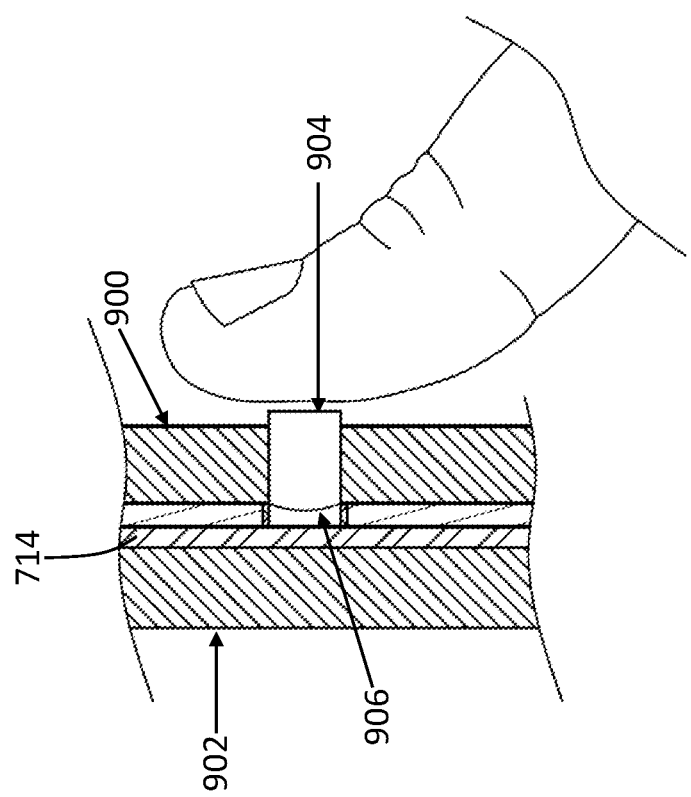

Each of the plurality of deformably resilient horn buttons 720a-n are also operably configured to translate, or move, to complete a circuit and generate an audible sound with the electrical horn. In some embodiments, the translation of the button(s) is linear, but may also be curvilinear or rotational. As such, the plurality of deformably resilient horn buttons 720a may include a static position along a button translation path projecting through one of the plurality enclosed apertures 716a-n (as best shown in FIG. 9). Said another way, the user will able to depress the button and, when released, the button will return to its static shape and configuration. Again, as best shown in FIG. 9, the rear surface 906 of the button can be seen disposed adjacent to the annular electrical circuit board member 714. The plurality of deformably resilient horn buttons 720a may also include a depressed position along the button translation with the rear surface 906 directly coupled to the annular electrical circuit board member (as best shown in FIG. 10). As such, the circuit board 714 may include individual portion configured to be aligned with each of the button(s) 720a-n to provide sufficient electrical coupling when depressed. The depressed position, which is conventionally done through the user's finger(s) or hand(s), electrically completes the circuit on the annular electrical circuit board member 714 and causes the electrical horn to generate the audible sound.

Figure 12:
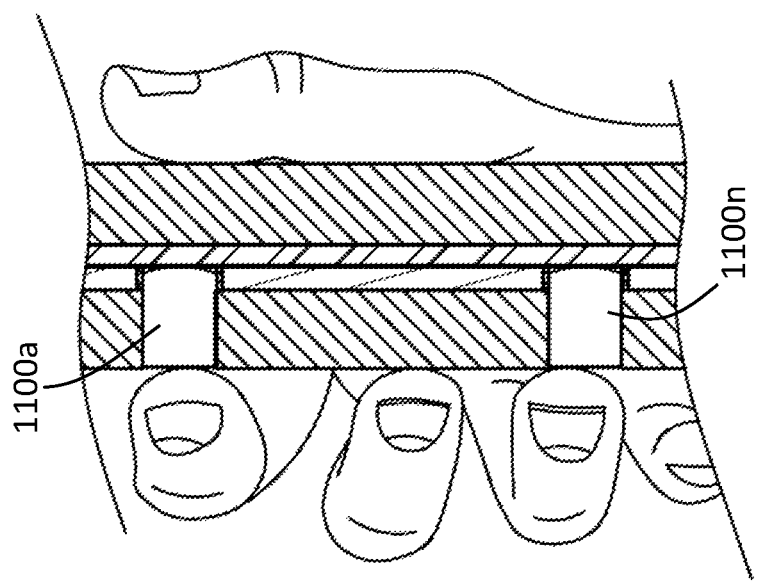
FIGS. 11-12 are close-up views of a button on an exemplary steering wheel horn assembly in a static position and depressed position, respectively, along a button translation path in accordance with one embodiment of the present invention.
Figure 11:
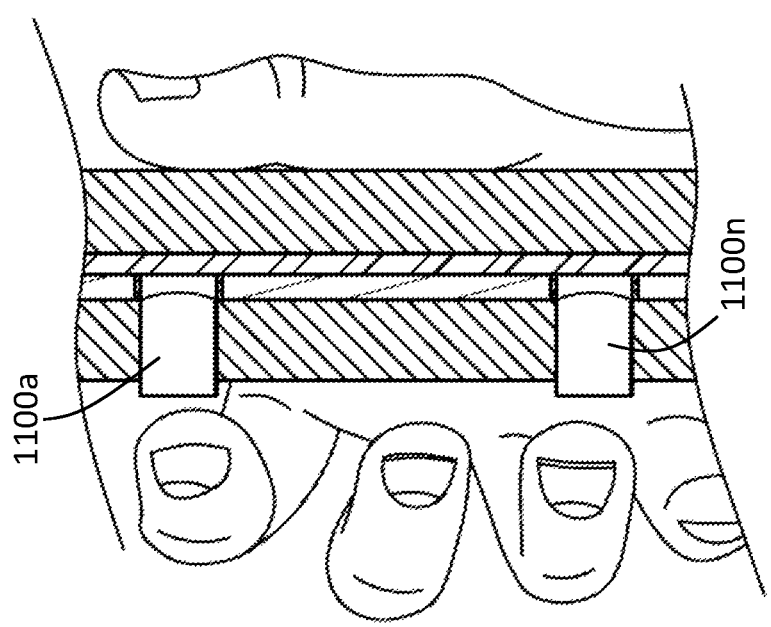

FIGS. 11-12 also depict static and depressed positions of button(s) 1100a-n, but depicts the button(s) disposed on the surface of the steering wheel body facing away from the user when sitting in the vehicle. Said another way, FIGS. 11-12 depict an embodiment, often the preferred embodiment, of the present invention when the user will be able to activate the horn through the rear surface on the steering wheel where the buttons are projecting therefrom. As shown best in FIG. 8, each of the button(s) 720a-n may include a selectively removable cap, of a substantially rigid material, coupled thereto.

As seen best in FIGS. 9-10, the terminal front surface 904 of each of the plurality of deformably resilient horn buttons 720a-n is displaced, when in the static position along the button translation path, a distance, e.g., approximately 0.2-1 inches, away from the front surface 900 of the first steering wheel body section 710 of the steering wheel body 708. In embodiment, the annular button membrane 718 is of a flexible and deformable material, e.g., an elastomer material like santoprene, neoprene, or natural rubber. In one embodiment, the annular button membrane 718 and the plurality of deformably resilient horn buttons 720a-n are of a unitary construction, e.g., casted or injection molded of a single material.

In one embodiment, the circular electrical circuit board member 714 and the annular button membrane 718 are encapsulated by the first and second steering wheel body sections 710, 712, whereby only the button(s) 720a-n are shown projecting from the steering wheel for depression by the user when he or she wants to activate the horn. The rear surface 906 on each of the plurality of deformably resilient horn buttons 720a-n may also include an electrically conductive material disposed thereon, e.g., a metallic electrically conductive coating. The depressed position includes the rear surface 906 directly and electrically coupled to the annular electrical circuit board member to electrically complete the circuit and cause the electrical horn to generate the audible sound. In other embodiments, the depressed position includes movement of a portion of the circular electrical circuit board member 714 that electrically completes the circuit that generates the audible sound of the horn.

In one embodiment, each of the plurality of deformably resilient horn buttons 720a-n are equally spaced circumferentially, e.g., approximately 1-4 inches, around the annular button membrane 718 to allow easy access by the user when handling the steering wheel. Said another way, each of the plurality of deformably resilient horn buttons 720a-n may be disposed in a 360° configuration around the steering wheel. In other embodiments, each of the plurality of deformably resilient horn buttons 720a-n may be disposed on the top and sides of the steering wheel.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:
1. A steering wheel horn assembly comprising:
a power source;
an electrical ground;
an electrical horn having an active mode generating an audible sound; and
a steering wheel body having:
a first steering wheel body section defining a front surface surrounding the steering wheel body and a plurality enclosed apertures disposed on the front surface;
a second steering wheel body section defining a rear surface, opposing the front surface, surrounding the steering wheel body, the first and second steering wheel body sections forming a circumference around the steering wheel body where the user grips the steering wheel body;

an annular electrical circuit board member interposed between the first and second steering wheel body sections and electrically coupled to the power source, the electrical ground, and the electrical horn; and an annular button membrane interposed between the annular electrical circuit board member and the first steering wheel body section and with multiple deformably resilient horn buttons surrounding the annular button membrane on at least a portion of opposing left and right sides and a portion of opposing upper and lower sides of the annular button membrane, each of the plurality of deformably resilient horn buttons having:
- a terminal front surface and a rear surface opposing the terminal front surface and disposed adjacent to the annular electrical circuit board member;
- a static position along a button translation path projecting through one of the plurality enclosed apertures; and
- a depressed position along the button translation path, when a user grips the circumference around the steering wheel body, with the rear surface directly coupled to the annular electrical circuit board member and electrically completing a circuit on the annular electrical circuit board member and causing the electrical horn to generate the audible sound.

2. The steering wheel horn assembly according to claim 1, wherein:
the terminal front surface of each of the plurality of deformably resilient horn buttons is displaced, when in the static position along the button translation path, a distance away from the front surface of the first steering wheel body section of the steering wheel body.

3. The steering wheel horn assembly according to claim 1, wherein:
the annular button membrane is of a flexible and deformable material.

4. The steering wheel horn assembly according to claim 3, wherein:
the annular button membrane is of a flexible and deformable thermoplastic elastomer material.

5. The steering wheel horn assembly according to claim 4, wherein:
the annular button membrane and the plurality of deformably resilient horn buttons are of a unitary construction.

6. The steering wheel horn assembly according to claim 5, wherein:
the circular electrical circuit board member and the annular button membrane are encapsulated by the first and second steering wheel body sections.

7. The steering wheel horn assembly according to claim 5, wherein the rear surface on each of the plurality of deformably resilient horn buttons further comprises:
an electrically conductive material disposed thereon, wherein the rear surface is directly and electrically coupled to the annular electrical circuit board member to electrically complete the circuit and cause the electrical horn to generate the audible sound.

8. The steering wheel horn assembly according to claim 7, wherein:
each of the plurality of deformably resilient horn buttons are equally spaced circumferentially around the annular button membrane.

* * * * *